(12) United States Patent
Tanzawa

(10) Patent No.: US 9,000,836 B2
(45) Date of Patent: Apr. 7, 2015

(54) VOLTAGE GENERATOR CIRCUIT

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 1331 days.

(21) Appl. No.: 11/972,483

(22) Filed: Jan. 10, 2008

(65) Prior Publication Data

US 2009/0179691 A1     Jul. 16, 2009

(51) Int. Cl.
H03K 3/01 (2006.01)
H02M 3/07 (2006.01)
G11C 16/30 (2006.01)
H02M 1/36 (2007.01)

(52) U.S. Cl.
CPC .............. H02M 3/073 (2013.01); G11C 16/30 (2013.01); H02M 1/36 (2013.01)

(58) Field of Classification Search
USPC ......................................... 327/534–540, 589
See application file for complete search history.

(56) References Cited

U.S. PATENT DOCUMENTS

| 5,359,244 | A | * | 10/1994 | Hopkins | 327/434 |
| 5,777,635 | A | * | 7/1998 | James et al. | 347/8 |
| 5,909,396 | A | | 6/1999 | Le et al. | |
| 6,452,441 | B1 | | 9/2002 | Kim et al. | |
| 6,759,912 | B2 | * | 7/2004 | Yamagishi et al. | 331/17 |
| 6,878,981 | B2 | * | 4/2005 | Eshel | 257/299 |
| 7,276,956 | B2 | * | 10/2007 | Furuta et al. | 327/534 |
| 7,439,792 | B2 | * | 10/2008 | Kwak et al. | 327/534 |
| 7,554,305 | B2 | * | 6/2009 | Nunokawa et al. | 323/273 |

OTHER PUBLICATIONS

Takashima, D., Standby/Active Mode Logic for Sub-1-V Operating ULSI Memory; *IEEE Journal of Solid-State Circuits*, Apr. 1994, pp. 441-447, vol. 29, No. 4.
Tanzawa, T., Circuit Techniques for a 1.8-V-Only NAND Flash Memory; *IEEE Journal of Solid-State Circuits*, Jan. 2002, pp. 84-89, vol. 37, No. 1.

* cited by examiner

*Primary Examiner* — Dinh Le
(74) *Attorney, Agent, or Firm* — Fletcher Yoder, P.C.

(57) ABSTRACT

Embodiments are provided that include a circuit for generating voltage in a memory. One such circuit includes a charge pump circuit including a first transistor, a high-voltage switch circuit, and a cut-off switch circuit arranged to reduce leakage current from the charge pump circuit. The cut-off switch circuit includes a second transistor, wherein an output of the charge pump circuit is coupled to one of a source node and a drain node of the second transistor, and a first control signal is input at a gate of the second transistor. Further embodiments provide a method for generating voltage. One such method includes enabling a first transistor coupled to an output of a charge pump circuit when the charge pump is operating and disabling the first transistor coupled to the output of the charge pump circuit when the charge pump circuit is not operating.

28 Claims, 10 Drawing Sheets

VOLTAGE GENERATOR CIRCUIT

BACKGROUND

1. Field of the Invention

Embodiments of the invention relate generally to the field of memory devices and more particularly, to reducing leakage currents and discharging power in a voltage generator circuit of a memory device.

2. Description of the Related Art

Flash memory is a non-volatile memory that can be electrically erased and reprogrammed. It is primarily used in memory cards, USB flash drives, and the like for storage of data in computer systems. Generally, flash memory stores information on an array of floating gate transistors, called "cells", each of which traditionally stores one bit of information. Each cell is characterized by a threshold voltage (Vt). By adding or removing charge from a floating gate, the threshold voltage of the cell changes, thereby defining whether the cell is programmed or erased. The threshold voltage level indicates the value for a single bit of information, generally represented as a 1 or 0. Multi-level cells may include more than two ranges that are representative of additional values, such as two or more bits of information. In memory cells, the voltages supplied include program verify voltages, read voltages, erase voltages, and the like. A memory device generally includes one or more voltage sources that provide these and other voltages to the cells of the memory array and/or to other locations within the memory device. In certain configurations, the supplied voltages are provided by internal voltage generators that are connected to transistors that make up the cells. For instance, each memory device can include multiple voltage generators that are configured to output a voltage for the program, read and verify operations.

To generate high voltages (e.g., voltages above a common voltage (Vcc)), such as program and erase voltages, the voltage generators often employ a charge pump circuit that is capable of supplying the desired voltage levels. The high voltage power output from the charge pump circuit is transferred to other locations in the flash memory via high-voltage switching circuits (HV switching circuits). Unfortunately, during periods when the charge pump circuit is not operating, the stand-by current of the charge pump circuit may leak to a lower-potential node. This may be referred to as a leakage current. For example, a leakage current can flow from the charge pump circuit through the HV switching circuit. Further, when the charge pump circuit is not operating, it may be desirable that charges remaining at nodes within the voltage generator be discharged. Discharging may avoid overstressing a cell with a voltage that could otherwise remain on the output lines.

Embodiments of the present invention may be directed to one or more of the problems set forth above.

DETAILED DESCRIPTION OF SPECIFIC EMBODIMENTS

Figure 1:
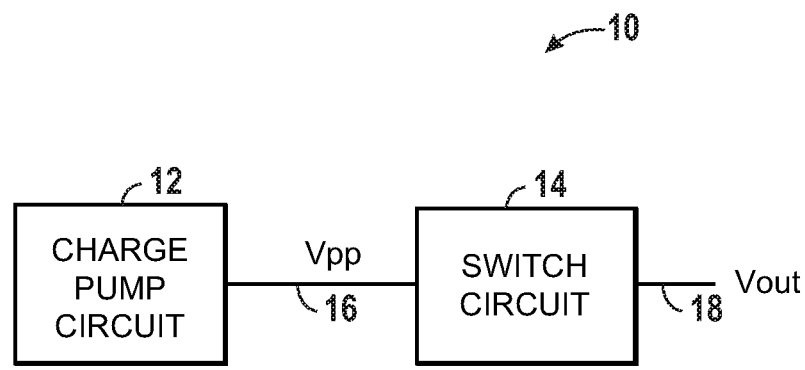
FIG. 1 is a block diagram illustrating a voltage generator in accordance with one or more embodiments of the present invention.

FIG. 1 includes a block diagram that depicts a voltage generator, as generally designated by reference numeral 10. The voltage generator 10 includes a charge pump circuit 12 and a switch circuit 14. The charge pump 12 includes a high-voltage output (Vpp) that is coupled to the switch circuit 14 via a path 16, and the switch circuit 14 includes an output voltage (Vout) on a path 18. High-voltage may be defined as a voltage level that is above the level of a common voltage (Vcc) of the system. For example, one embodiment, the program, verify and/or erase voltages may be above the common voltage (Vcc) (i.e., high-voltage). Accordingly, a high-voltage charge pump circuit may include a first transistor, an input at a supply voltage and an output voltage that is higher than the supply voltage, for instance. The path 18 from the switch circuit 14 may be electrically coupled to various locations in a memory device, such as the transistors of memory cells, or other power consuming devices. Accordingly, the high-voltage output (Vpp) of the charge pump 12 can be routed via the switch circuit 14 to various locations in the memory device. Similar to a high-voltage charge pump circuit, a high-voltage switch circuit may include an output that is higher than the common voltage (Vcc).

Figure 2:
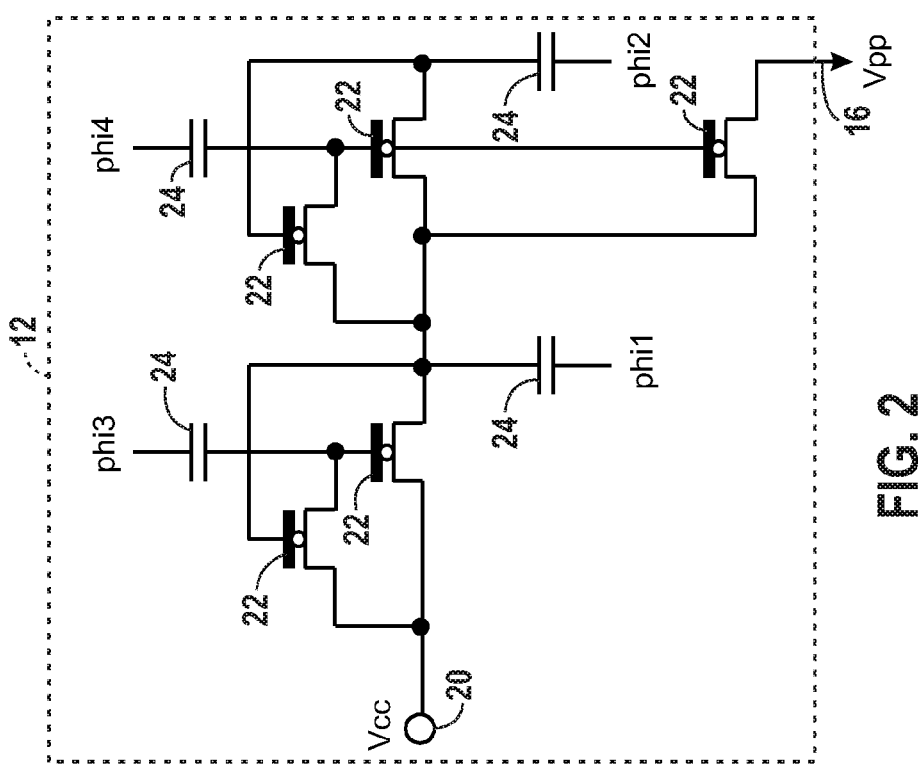
FIG. 2 is a schematic diagram illustrating a charge pump circuit of the voltage generator in accordance with one or more embodiments of the present invention.

FIG. 2 illustrates an embodiment of the charge pump circuit 12. The charge pump circuit 12 includes a common-collector voltage (Vcc) that is provided to the charge pump circuit 12 via an input node 20. Further, the charge pump circuit 12 includes a plurality of transistors 22. In one embodiment, the transistors 22 include low-threshold voltage (Vt) high-voltage nmosfets (HV nmosfets). The low Vt HV nmosfets can operate with a low Vcc (e.g., Vt having a value of about 0.2V and Vcc having a value of about 3V). The charge pump circuit 12 also includes a plurality of capacitors 24. The capacitors 24 are capable of storing power having a higher voltage than Vcc. For instance, in operation, the transistors 22 are implemented as switches that are enabled and disabled cooperatively to charge the capacitors 24. The high-voltage output (Vpp) of the charge pump circuit 12 is output via the path 16, as discussed previously with regard to FIG. 1.

Figure 3:
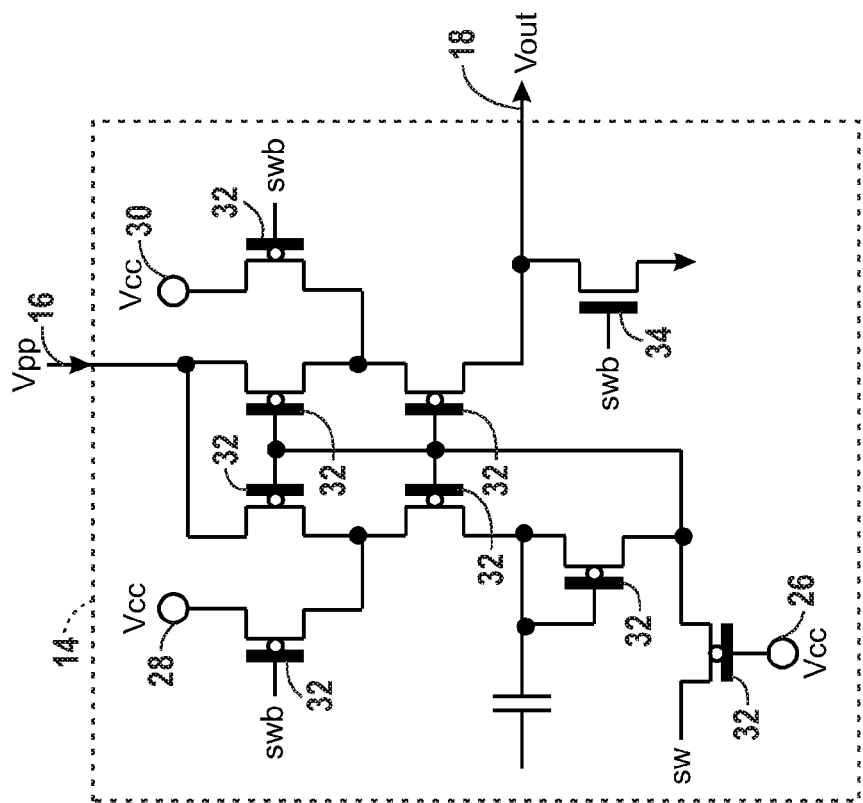
FIG. 3 is a schematic diagram illustrating a high-voltage switching circuit of the voltage generator in accordance with one or more embodiments of the present invention.

FIG. 3 illustrates an embodiment of the switch circuit 14. The switch circuit 14 includes a high-voltage switch circuit. Power at the Vcc level is provided to the switch circuit 14 via three inputs 26, 28 and 30. An input of the switch circuit 14 includes Vpp that is routed to the switch circuit 14 via the path 16. The path 16 carries Vpp from the charge pump circuit 12 to the switch circuit 14. As is discussed below with regard to FIGS. 4-9, the path 16 may also route other voltage levels (e.g., Vppo) into the switch circuit 14. The switch circuit 14 also includes a plurality of transistors 32. In one embodiment, the transistors 32 may be low Vt nmosfets. The switch circuit also includes a transistor 34 coupled to the path 18 of Vout. In one embodiment, the transistor 34 includes a normal-threshold voltage high-voltage nmosfet (Vt HV nmosfet). The output voltage (Vout) of the switch circuit 14 is output via the path 18, as discussed previously with regard to FIG. 1.

In operation of the voltage generator 10, the charge pump circuit 12 receives the incoming power (Vcc) and incrementally stores the power in the capacitors, in turn storing power with a voltage level that is higher than Vcc. The charge pump circuit 12 discharges the high-voltage output (Vpp) across the path 16. The switch circuit 14 receives the power (Vpp) and routes the output power (Vout) to various locations within a memory device. For instance, the switch circuit 14 may be embedded in a row decoder that routes the output power (Vout) to a gate of a memory cell transistor. Unfortunately, when the switch circuit 14 is disabled (e.g., closed), a leakage current may still exist across the switch circuit 14, draining current from the charge pump circuit 12.

Figure 4:
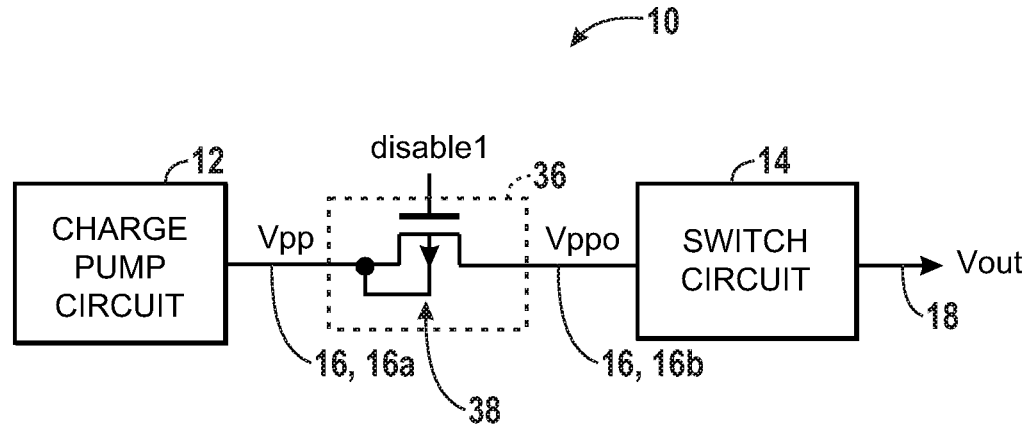
FIG. 4 is a block diagram illustrating a voltage generator including a cut-off switch circuit in accordance with one or more embodiments of the present invention.

FIG. 4 illustrates an embodiment of the voltage generator 10 that includes an additional cut-off switch circuit 36. The cut-off switch circuit 36 can be configured to reduce or possibly eliminate the leakage current. In the illustrated embodiment, the cut-off switch circuit 36 is disposed in the path 16, between the charge pump circuit 12 and the switch circuit 14. The path 16 is split into a path 16a carrying the high voltage (Vpp) from the charge pump circuit 12 to the cutoff switching circuit 36, and a path 16b routing a high voltage (Vppo) output of the cut-off switch circuit 36 to the switch circuit 14.

In the illustrated embodiment, the cut-off switch circuit 36 includes a transistor 38. The transistor 38 includes a standard-threshold voltage high-voltage pmosfet. A pmosfet having a large channel width may have a small voltage drop across the transistor 38. Accordingly, the level of the high voltage (Vppo) on the path 16b may be equal to or less than the high voltage (Vpp) at the path 16a.

The output of the charge pump circuit 12 is coupled to a node (e.g., a source node) of the transistor 38, and a control signal (disable1) is input to a control gate of the transistor 38. The switch circuit 14 is coupled to a node (e.g., a drain node) of the transistor 38. Accordingly, based on the level of the control signal (disable1), the transistor 38 can limit the current that passes from the charge pump circuit 12 to the switch circuit 14.

For example, when the control signal (disable1) is in a logic-high state, the transistor 38 is disabled, blocking current from being conducted across the transistor 38, and reducing the potential that a leakage current exists across the switch circuit 14. The logic-high state of the control signal (disable1) can include various voltage levels that are dependent on the threshold voltage level of the transistor 38. In one embodiment, the logic-high state of the control signal (disable1) includes Vcc. In other words, the voltage level of the logic-high of the control signal (disable1) is the same as the supply voltage level of the charge pump circuit 12.

When the control signal (disable1) is in a logic-low state, the transistor 38 is enabled, and current can be conducted across the transistor 38 to the switch circuit 14. The logic-low state of the control signal (disable1) can include various voltage levels that are dependent on the threshold voltage level of the transistor 38. In one embodiment, the logic-low state of the control signal (disable1) includes about zero volts (V).

In operation of the voltage generator 10, the state/voltage level of the control signal (disable1) input to the gate of the transistor 38 is varied based on the operation of the charge pump circuit 12. For example, when the charge pump circuit 12 is not operating (e.g., not configured to generate the high voltage output (Vpp) on the path 16), the transistor 38 is disabled, and when the charge pump circuit 12 is operating (e.g., configured to generate the high voltage output (Vpp) on the path 16), the transistor 38 is enabled. In other words, the control signal (disable1) is maintained in a logic-high state when the charge pump circuit 12 is not operating and is maintained in a logic-low state when the charge pump circuit 12 is operating. The logic-high state can include a voltage level of Vcc, as discussed previously, and the logic-low state can include a voltage below Vcc, such as at or near 0V. Accordingly, when the charge pump circuit 12 is not operating, a Vcc level control signal disables the transistor 38 to reduce the leakage current across the switch circuit 14, and when the charge pump circuit 12 is operating, a 0V level control signal enables the transistor 38 such that a current can flow across from the charge pump circuit 12, across the transistor 38, and be routed via the switch circuit 14.

After the charge pump circuit 12 operates, and is no longer operating, a charge may remain in the voltage generator 10. For example, after the charge pump circuit 12 operates and the transistor 38 is disabled, a charge may remain in the charge pump circuit 12, the switch circuit 14, the path 16 between them, and the output path 18 of the switch circuit 14. The high voltage level (Vppo) may be floating. If the charge remains, a portion of the memory device coupled to the output path 18 of the switch circuit 14 (e.g., a gate of a memory cell) may continue to be exposed to the voltage due to the remaining charge. The charge may be discharged to avoid overstressing a memory cell with the voltage.

Figure 5:
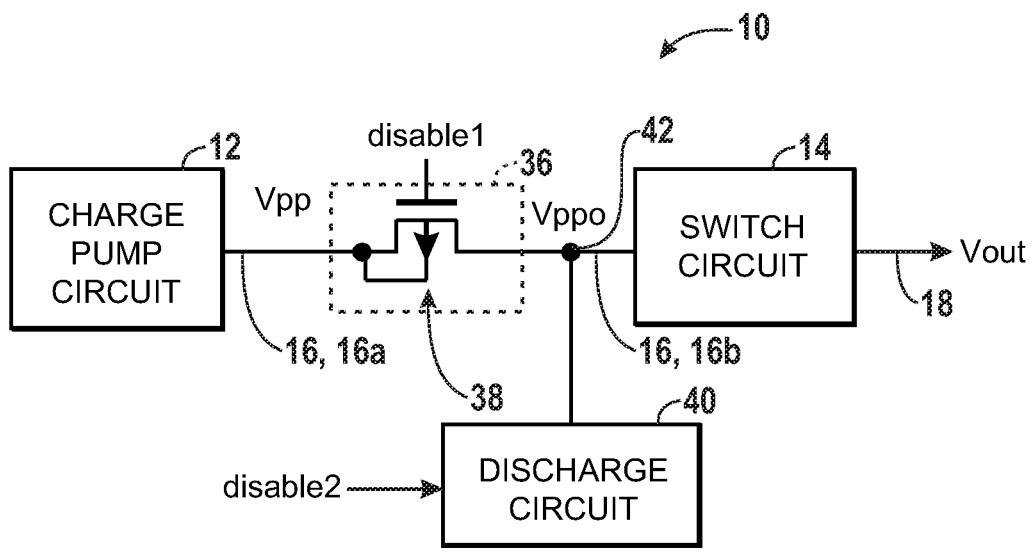
FIG. 5 is a block diagram illustrating a voltage generator including a discharge circuit in accordance with one or more embodiments of the present invention.

FIG. 5 illustrates an embodiment of the voltage generator 10 including a discharge circuit 40 coupled to a node 42 on the path 16b between the transistor 38 and the switch circuit 14. A control signal (disable2) is routed into the discharge circuit 40. The discharge circuit 40 is employed to discharge charges in the voltage generator 10 to a lower potential during a period when the charge pump circuit 12 is not operating.

Figure 6:
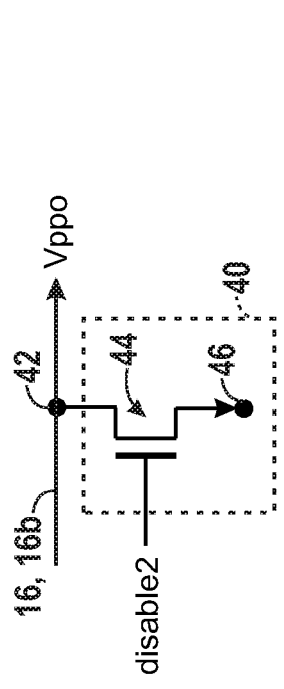
FIG. 6 is a schematic diagram illustrating a discharge circuit in accordance with one or more embodiments of the present invention.

FIG. 6 illustrates an embodiment of the discharge circuit 40. The discharge circuit 40 includes a transistor 44. In the illustrated embodiment, the transistor 44 includes an nmosfet device. A drain node of the transistor 44 is coupled to the node 42 between the cut-off switch circuit 36 and the switch circuit 14, and is, in turn, coupled to the drain node of the transistor 38 of the cut-off switching circuit 36. A source node 46 of the transistor 44 is coupled to a lower-potential node 46, having a lower potential than the node 42 between the cut-off switch circuit 36 and the switch circuit 14. In one embodiment, the lower-potential node 46 is coupled to ground. The control signal (disable2) is coupled to a gate of the transistor 44.

When the voltage level of the control signal (disable2) is high enough, the gate bias (Vg) is greater than the threshold voltage (Vt) of the transistor 44, and within the transistor 44 an inversion layer is formed that enables the flow of electrons (e.g., current). In other words, the transistor 44 is enabled, and current can be conducted from the drain (node 42) to the source (node 46) of the transistor 44. In the illustrated embodiment, where the control signal (disable2) is logic-high and is greater than the threshold voltage (Vt), the transistor 44 of the discharge circuit 40 is enabled, and charges at the node 42 between the cut-off switch circuit 36 and the switch circuit 14 are discharged.

When the voltage level of the control signal (disable2) is too low, the gate bias (Vg) is less than the threshold voltage (Vt) of the transistor 44, and an inversion layer is not formed across the transistor 44. In other words, the transistor 44 is disabled, and current is blocked from flowing from the drain (node 42) to the source (node 46) of the transistor 44. In the illustrated embodiment, where the control signal (disable2) is logic-low and is less than the threshold voltage (Vt), the transistor 44 of the discharge circuit 40 is disabled, and the charge at the node 42 between the cut-off switch circuit 36 and the switch circuit 14 is not discharged.

Even when the control signal (disable1) is in a logic-low state, the high voltage level (Vpp) and the voltage of the internal nodes of the of charge pump circuit 12 do not fall below the absolute value of the threshold voltage (Vt) of the transistor 38. The voltage generator 10 can eliminate a large peak current, and a large stand-by current without much, if any, overhead in area or complexity.

The level of the control signals (disable1 and disable2) can be varied based on the application. For example, the control signals (disable1 and disable2) may include logic-high and or logic-low states that are above Vcc, below Vcc, the same as Vcc, or any combination thereof. Further, the control signals (disable1 and disable2) can have logic levels that are different from one another or that are the same. In one embodiment, the control signal input into the transistor 38 (disable1) and the control signal (disable2) input to the gate of the transistor 44 have the same logic-high and logic-low voltage levels. For example, the logic-high level of the control signals is Vcc and/or the logic-low level is approximately 0V. Further, in one embodiment, the control signals (disable1 and disable2) are the same signal that is input to the gates of both of the transistors 38 and 44. In other words the control signals (disable1 and disable2) have approximately the same profile, and may be received from the same source or a different source.

Figure 7A:
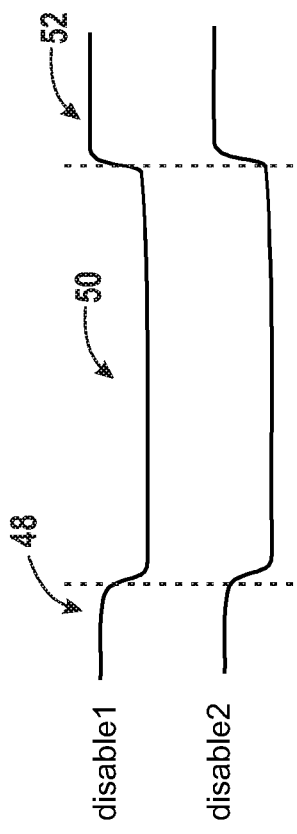
FIGS. 7A and 7B are timing diagrams of control signals in accordance with one or more embodiments of the present invention.

FIG. 7A illustrates a timing diagram of an embodiment where the control signals (disable1 and disable2) are the same. For example, in a first region 48, the control signals (disable1 and disable2) are both in a logic-high state, in a second region 50 the control signals (disable1 and disable2) are both in a logic-low state, and in a third region 52 the control signals (disable1 and disable2) are both in logic-high state. In one embodiment, the first region 48 and the third region 52 include a period where the charge pump circuit 12 is not operating, and the second region 50 includes a period where the charge pump circuit 12 is operating. Accordingly, in the first region 48 and third region 52, the transistor 38 is disabled by the logic-high control signal (disable1) to block the leakage current, and the transistor 44 is enabled by the logic-high control signal (disable 2) to discharge the remaining charge. In the second region 50, the transistor 38 is enabled by the logic-low control signal (disable1) to enable current to flow to the switch circuit 14, and the transistor 44 is disabled by the logic-low control signal (disable 2) to block current from discharging to the lower-potential node 46.

Figure 7B:
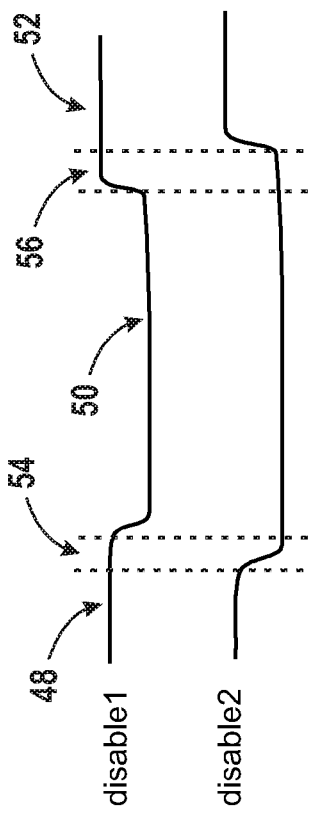

FIG. 7B illustrates a timing diagram for an alternate embodiment of the control signals (disable1 and disable2). The control signals (disable1 and disable2) include a delay between their transition states such that logic of the control signal (disable1) changes from a high to low state after the control signal (disable2) changes from the high to low state, and the control signal (disable1) changes from the low to the high state prior to the control signal (disable2) changing from the low to high state. For example, a first delay region 54 includes a delay between the transition of the control signals (disable1 and disable2) from the logic-high state to the logic-low state, and a second delay region 56 includes a delay between the of the transition of the control signals (disable1 and disable2) from the logic-low state to the logic-high state. The delay between the transition of the control signals (disable1 and disable2) may prevent a direct path (e.g. short) between the charge pump circuit 12 and the lower-potential node 46. In other words, the delay may help to ensure that the transistor 38 is enabled only when the transistor 44 is disabled. Where the threshold voltage (Vt) of the transistor 38 is not high (e.g., less than Vcc), the timing diagram of FIG. 7B may reduce the likelihood of the high voltage level (Vpp) from reducing to or below a level that is the sum of Vcc and the absolute value of the voltage threshold of the transistor 38.

Figure 8:
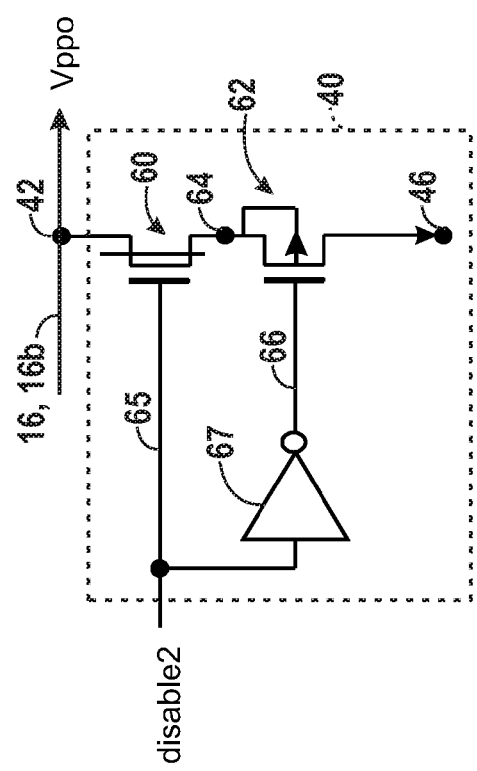
FIG. 8 is a schematic diagram illustrating a discharge circuit in accordance with one or more alternate embodiments of the present invention.

FIG. 8 illustrates an alternate embodiment of the discharge circuit 40. The discharge circuit 40 of FIG. 8 includes a first transistor 60 and a second transistor 62. In the illustrated embodiment, the first transistor 60 includes depletion-type nmosfet device, and the second transistor 62 includes an enhancement-type pmosfet device.

A drain node of the first transistor 60 is coupled to the node 42 between the cut-off switch circuit 36 and the switch circuit 14, and is, in turn, coupled to the drain node of the transistor 38 of the cut-off switch circuit 36. A source node 64 of the first transistor 60 is coupled to a source node of the second transistor 62. A drain of the second transistor 62 is coupled to the lower-potential node 46. In one embodiment, the lower-potential node 46 is coupled to ground.

The control signal (disable2) is coupled a gate of the first transistor 60 via a direct path 65. The control signal (disable2) is coupled to a gate of the second transistor via a second path 66. The second path 66 includes an inverter 67 between the input of the control signal (disable2) and the gate of the second transistor 62. Accordingly, the control signal (disable2) at the gate of the second transistor 62 includes a logic level that is the inverse of the control signal (disable2) at the gate of the first transistor 60.

During a period while the voltage (Vppo) at the node 42 is charged to the high voltage level (Vpp), the control signal (disable2) is set at a logic-low state. During this period, the voltage at the source node of the first transistor 60 reaches the level of the absolute value of the threshold voltage of the first transistor 60. When the sum of the absolute value of the threshold voltage of the second transistor 62 and the voltage level of Vcc is greater than the absolute value of the threshold voltage of the first transistor 60, the discharging circuit 40 is cut-off such that current does not flow across the discharging circuit 40 to the lower-potential node 46.

After the charge pump circuit 12 is disabled, the discharge operation begins. The control signal (disable2) is driven to a logic-high level. Early in the discharge operation, the voltage at the source node of the first transistor 62 is the sum of Vcc and the absolute value of the threshold voltage of the first transistor 60. When the sum of Vcc and the absolute value of the threshold voltage of the first transistor 60 is greater than the absolute value of the threshold voltage of the second transistor 62, the second transistor 62 is enabled and charges at the node 42 (e.g., Vppo) are discharged. When the voltage level (Vppo) at the node 42 reaches the absolute value of the threshold voltage of the second transistor 62, the discharging operation is automatically stopped.

When Vcc is about 3V, the threshold value of the first transistor 60 and the second transistor 62 may be set to about −3V. Accordingly, after the discharging operation, the output voltage (Vout) at the path 18 may remain at a voltage level approximately equivalent to Vcc. Other embodiments may include other settings (e.g. threshold voltages and levels for Vcc).

Where the threshold voltage of the first transistor 60 is higher than Vcc, the lower-potential node 46 may be coupled to Vcc. In such a configuration, the charges from the output voltage (Vout) at the path 18 return to Vcc and can be recycled. This is possible because no forward bias regime occurs while the discharger circuit 40 is disabled, and this is because the source voltage of the second transistor 62 (the absolute value of the threshold voltage of the first transistor 60) is higher than the drain voltage (Vcc).

Figure 9:
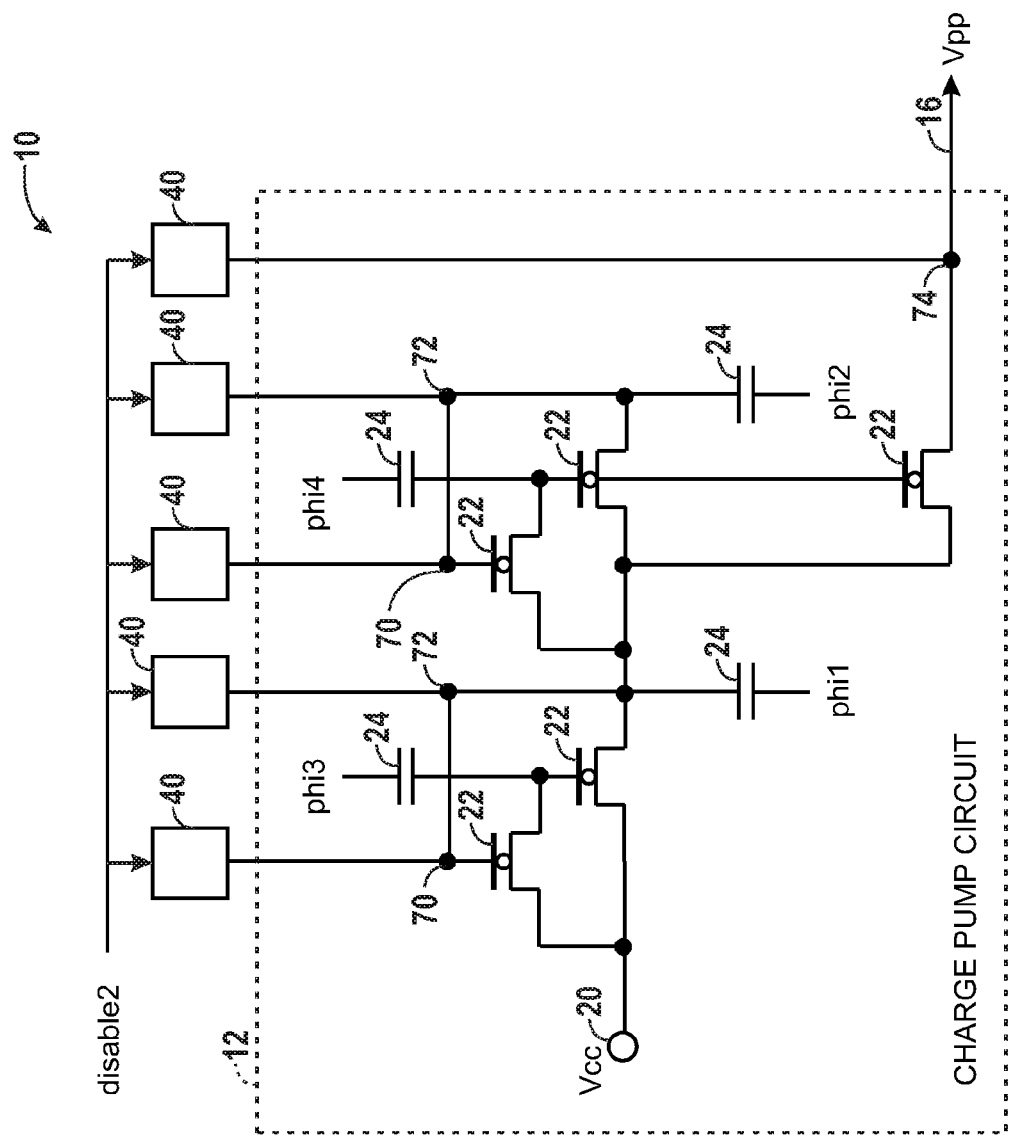
FIG. 9 is a schematic diagram illustrating a voltage generator including a plurality of discharge circuits in accordance with one or more embodiments of the present invention.

FIG. 9 illustrates an embodiment of the voltage generator 10 including discharge circuits 40 coupled to internal nodes of the charge pump circuit 12. For example, in the illustrated embodiment, five discharge circuits 40 are coupled to nodes of the charge pump circuit 12. Two of the discharge circuits 40 are coupled to nodes 70 proximate the gates of the transistors 22, two of the discharge circuits 40 are coupled to nodes 72 proximate capacitors 24, and one of the discharge circuits 40 is coupled to a node 74 on the path 16 outputting the high voltage (Vpp). The control signal (disable2) is input in parallel to each of the discharge circuits 40. Accordingly, the control signal (disable2) may simultaneously control each of the discharge circuits 40 to discharge the charge pump circuit 12 in a manner similar to that discussed previously with regard to FIGS. 5-8. Embodiments may include any number of discharge circuits 40 coupled to any number of internal nodes of the charge pump circuit 12.

Figure 10:
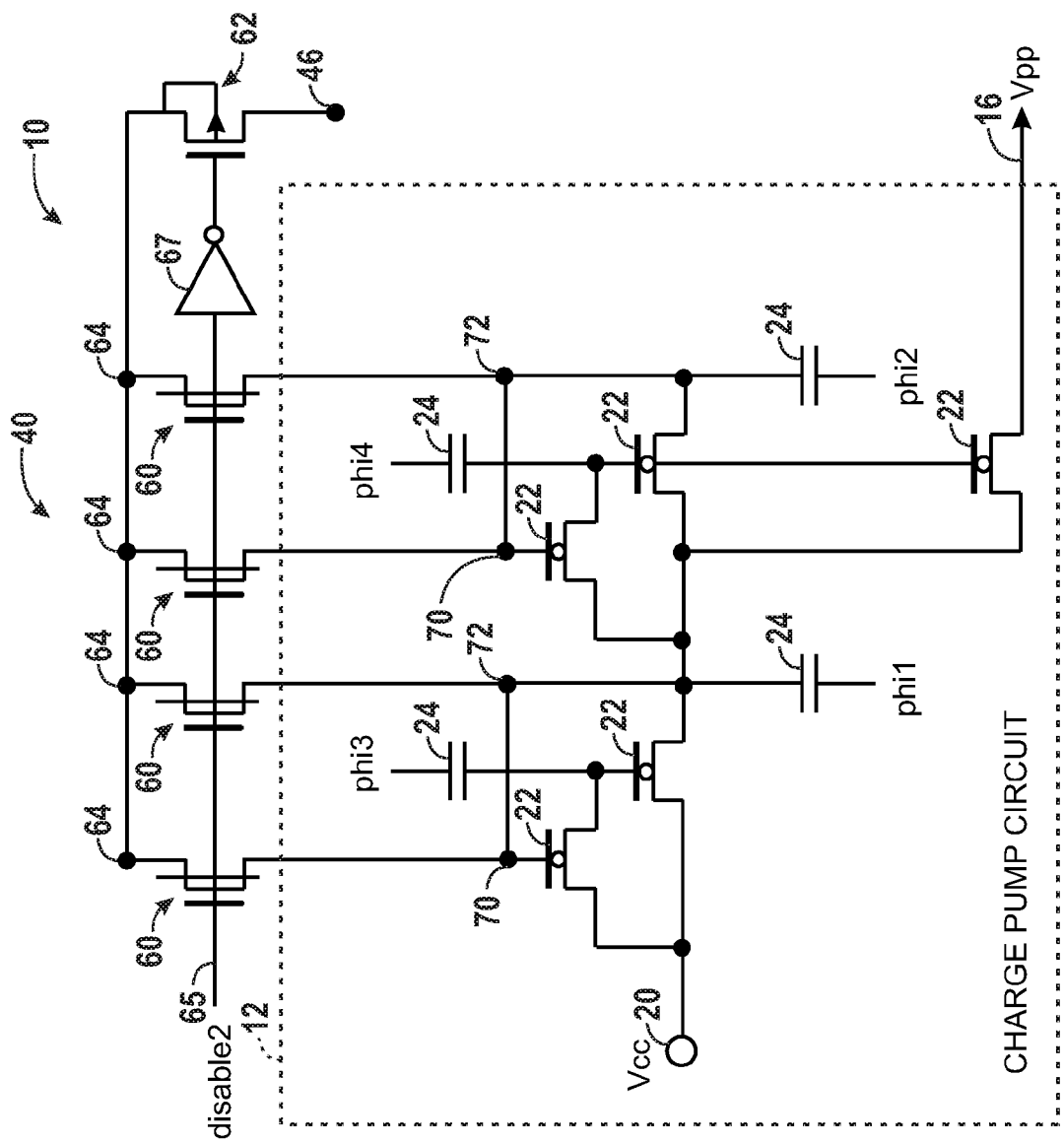
FIG. 10 is a schematic diagram illustrating a voltage generator including a plurality of discharge circuits in accordance with one or more alternate embodiments of the present invention.

The charge pump circuits 40 may include the charge pump circuits discussed with regard to FIG. 6 and FIG. 8, or any combination thereof. FIG. 10 illustrates an embodiment of the voltage generator 10 employing a plurality of transistors coupled to one another in a similar fashion as the embodiments discussed with regard to FIG. 8. The voltage generator 10 and discharge circuit 40 include four of the first transistors 60 and one of the second transistor 62. In one embodiment, the first transistors 60 include a depletion-type nmosfet device, and the second transistor 62 includes an enhancement-type pmosfet device.

The drain node of each of the first transistors 60 is coupled to at least one internal node of the charge pump circuit 12. For example, two of the first transistors 40 are coupled to nodes 70 proximate the gates of the transistors 22, two of the first transistors 40 are coupled to nodes 72 proximate capacitors 24. The source node 64 of each of the first transistors 60 is coupled to the source node of the second transistor 62. Similar to the previously discussed embodiments, the drain node of the second transistor 62 is coupled to a lower-potential node 46. In one embodiment, the lower-potential node 46 is coupled to ground. In some embodiment, the lower-potential node 46 may be coupled to Vcc, or the like.

The control signal (disable2) is coupled in parallel to the gate of each of the first transistors 60 via the path 65. The control signal (disable2) is coupled to the gate of the second transistor via the second path 66. The second path 66 includes the inverter 67 between the input of the control signal (disable2) and the gate of the second transistor 62. Accordingly, the control signal at the gate of the second transistor 62 includes a logic level that is the inverse of the control signal (disable2) at the gate of the first transistor 60.

Similar to the embodiments discussed with regard to FIG. 8, the discharge circuit 40 can be controlled via the control signal (disable2) to discharge the internal nodes of the charge pump circuit 12. Embodiments may include any number of discharge circuits 40 coupled to any number of internal nodes of the charge pump circuit 12.

Figure 11:
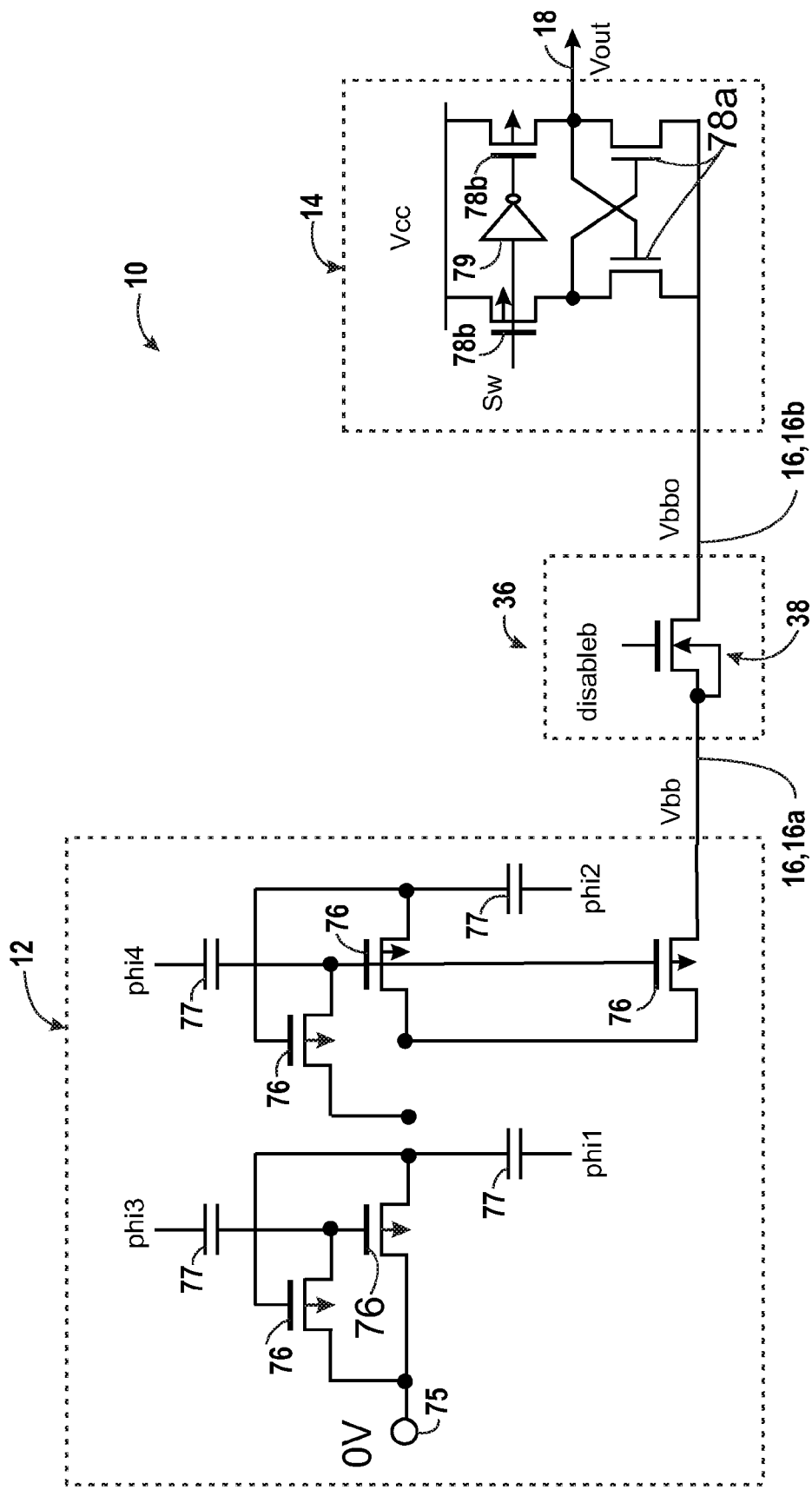
FIG. 11 is a block diagram illustrating a voltage generator including a cut-off switch circuit in accordance with one or more embodiments of the present invention.

Although the previous embodiments may include the transistor 38 of the cut-off switch circuit 36 having a given polarity, such as NPN type polarity, additional embodiments of the voltage generator 10 may include the transistor 38 having a different polarity, such as PNP type polarity. These embodiments may also include variations in the configurations of the charge pump circuit 12 and the switch circuit 14. For example, FIG. 11 illustrates an embodiment of the voltage generator 10 including the cut-off switch circuit 36 having a transistor 38 with a polarity (e.g., PNP) that is opposite from the polarity discussed previously (e.g., NPN). In such an embodiment, the charge pump circuit 12 and the switch circuit 14 are disconnected from one another when the control signal (disableb) of the cut-off switch 36 is in the disabled (low) state, and the charge pump circuit 12 and the switch circuit 14 are connected to one another with the control signal (disableb) of the cut-off switch 36 in an enabled (high) state.

In the illustrated embodiment, the cut-off switch 36 is disposed between the charge pump circuit 12 and the switch circuit 14, in a similar configuration to those discussed previously. As depicted, the charge pump circuit 12 is capable of providing a voltage output (Vbb) that has a voltage level below the common voltage (Vcc) or negative voltage level. For example, in the illustrated embodiment, a voltage level of zero volts (0V) is provided to the charge pump circuit 12 via an input node 75, and a low (e.g., a negative) voltage output (Vbb) of the charge pump circuit 12 is output via the path 16. As depicted, the charge pump circuit 12 includes a plurality of transistors 76 and capacitors 77 having a configuration that is similar to that discussed previously with regard to FIG. 1. The switch circuit 14 includes a first pair of transistors 78a, a second pair of transistors 78b, and an inverter 79. A switch control signal (SW) is input to the switch circuit 14 to control whether the switch circuit 14 is enabled or disabled. In one embodiment, the switch control signal (SW) may alternate between approximately 0V and the common voltage (Vcc) to control the state of the switching circuit 14. In the illustrated embodiment, the switch control signal (SW) is input at a terminal of a first of the second pair of transistors 78b, and the switch control signal (SW) is routed to a gate of a second of the second pair of transistor 78b after passing through the inverter 79. Further, the common voltage (Vcc) is coupled to one of a source and a drain node of the second pair of transistors 78b, and an input voltage (Vbbo) is coupled to one of a source node and a drain node of the first pair of transistors 78a. The output voltage (Vout) of the switch circuit 14 is output via the path 18, as discussed previously with regard to FIG. 1. Accordingly, in operation of the voltage generator 10, the output (Vbb) of the charge pump circuit 12 can be routed via the cut-off switch 36 the switch and the switch circuit 14 based on the control signals (disableb and SW). It should be noted that other embodiments may include any combination of the previously discussed embodiments. For example, the embodiment depicted in FIG. 11 may be modified to include the discharging circuits discussed with regard to FIGS. 5-10.

Figure 12:
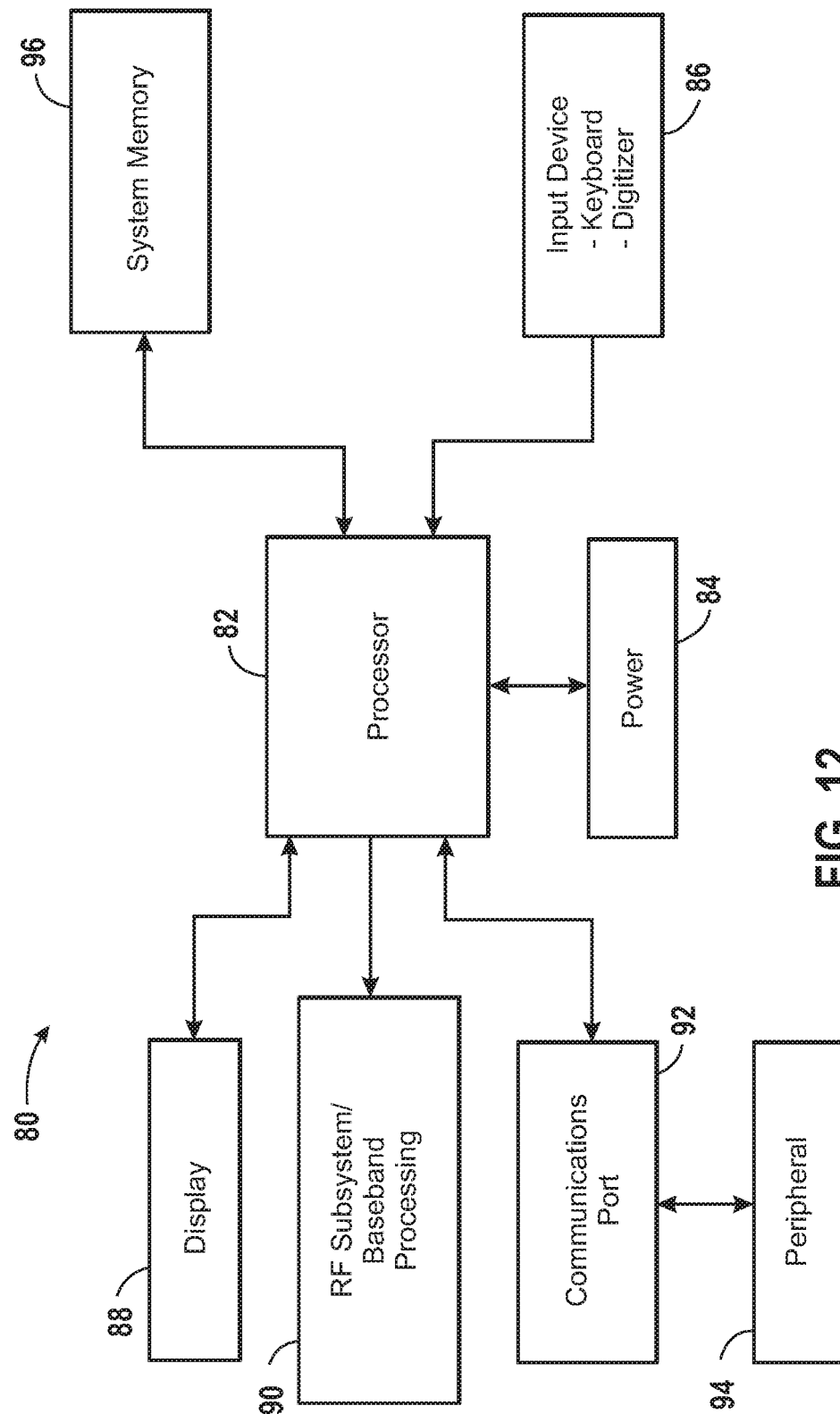
FIG. 12 illustrates a block diagram of a processor-based device having a memory that includes memory devices in accordance with one or more embodiments of the present invention.

The previous embodiments have been discussed with regard to a voltage generator 10. As will be appreciated voltage generators 10 can be included in any variety of electronic devices and processor based systems. For example, FIG. 12 illustrates a block diagram depicting a processor-based system, generally designated by reference numeral 80. The system 80 may be any of a variety of types such as a computer, pager, cellular phone, personal organizer, control circuit, etc. In a typical processor-based device, a processor 82, such as a microprocessor, controls the processing of system functions and requests in the system 80. Further, the processor 82 may comprise a plurality of processors that share system control.

The system 80 typically includes a power supply 84. For instance, if the system 80 is a portable system, the power supply 84 may advantageously include permanent batteries, replaceable batteries, and/or rechargeable batteries. The power supply 84 may also include an AC adapter, so the system 80 may be plugged into a wall outlet, for instance. The power supply 84 may also include a DC adapter such that the system 80 may be plugged into a vehicle cigarette lighter, for instance.

Various other devices may be coupled to the processor 82 depending on the functions that the system 80 performs. For instance, a user interface 86 may be coupled to the processor 82. The user interface 86 may include buttons, switches, a keyboard, a light pen, a mouse, and/or a voice recognition system, for instance. A display 88 may also be coupled to the processor 82. The display 88 may include an LCD display, a CRT, LEDs, and/or an audio display, for example.

Furthermore, an RF sub-system/baseband processor 90 may also be couple to the processor 82. The RF sub-system/baseband processor 90 may include an antenna that is coupled to an RF receiver and to an RF transmitter (not shown). A communications port 92 may also be coupled to the processor 82. The communications port 92 may be adapted to be coupled to one or more peripheral devices 94 such as a modem, a printer, a computer, or to a network, such as a local area network, remote area network, intranet, or the Internet, for instance.

Because the processor 82 controls the functioning of the system 80 by implementing software programs, memory is used to enable the processor 82 to be efficient. Generally, the memory is coupled to the processor 82 to store and facilitate execution of various programs. For instance, the processor 82 may be coupled to system memory 96, which may include volatile memory, such as Dynamic Random Access Memory (DRAM) and/or Static Random Access Memory (SRAM). The system memory 96 may also include non-volatile memory, such as read-only memory (ROM), EEPROM, and/or flash memory to be used in conjunction with the volatile memory. As discussed further below, the system memory 96 may include one or more memory devices, such as flash memory devices, that may include a floating gate memory array fabricated in accordance with one or more embodiments of the present invention.

Figure 13:
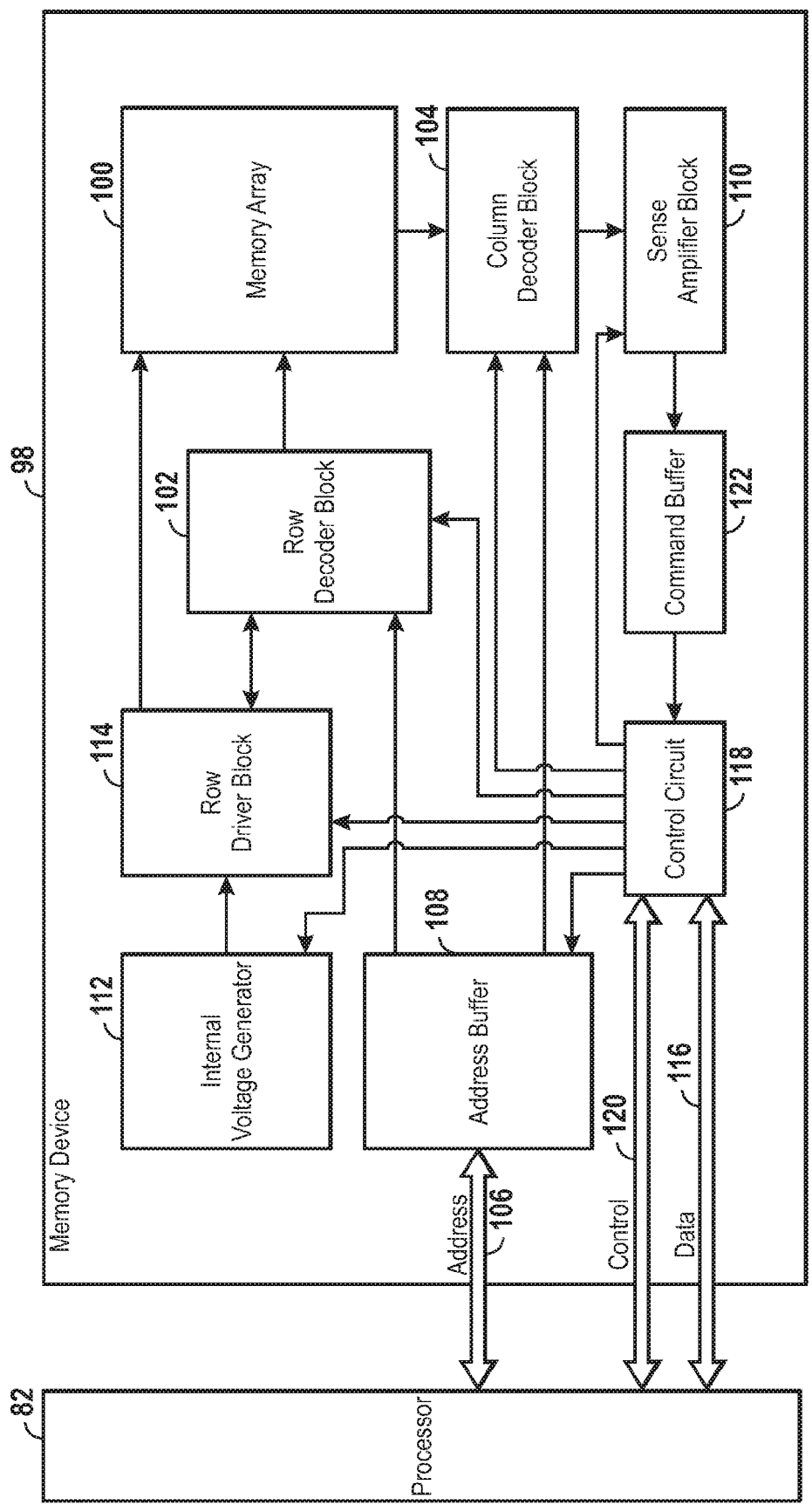
FIG. 13 illustrates a block diagram of a memory device having a memory array in accordance with one or more embodiments of the present invention.

FIG. 13 is a block diagram illustrating a flash memory device 98 that may be included as a portion of the system memory 96 of FIG. 1. As will be described further below with respect to FIG. 14, the flash memory device 98 may be a NAND flash memory device. The flash memory device 98 generally includes a memory array 100. The memory array 100 generally includes many rows and columns of conductive traces arranged in a grid pattern to form a number of memory cells. The rows or "row lines" that make up the memory array 100 are generally referred to as "wordlines." The columns or "column lines" are generally referred to as "bit lines" or "digit lines." The size of the memory array 100 (i.e., the number of memory cells) will vary depending on the size of the flash memory device 98.

To access the memory array 100, a row decoder block 102 and a column decoder block 104 are provided and are configured to receive and translate address information from the processor 82 via the address bus 106 and the address buffer 108 to access a particular memory cell in the memory array 100. A sense amplifier block 110 having a plurality of the sense amplifies is also provided inline with the column decoder 104 and the memory array 100 to sense and amplify individual values stored in the memory cells. A row driver block 114 is provided to activate a selected word line in the memory array according to a given row address.

An internal voltage source 112, such as a voltage generator, is provided to deliver voltages for use within the memory device 98. For instance, the internal voltage source 112 may provide voltage levels for program, read and erase operations.

During read and program operations, data may be transferred to and from the flash memory device 98 via the data bus 116. The coordination of the data and address information may be conducted through a control circuit 118. Further, the control circuit 118 may be configured to receive control signals from the processor 82 via the control bus 120. A command buffer 122 may be configured to temporarily store commands of the control circuit 118. The control circuit 118 is coupled to each of the row decoder block 102, the column decoder block 104, the address buffer 108, the sense amplifier block 110, the internal voltage generator 112, the row driver block 114, and the command buffer 122, and is generally configured to coordinate timing and control among the various circuits in the flash memory device 98.

Figure 14:
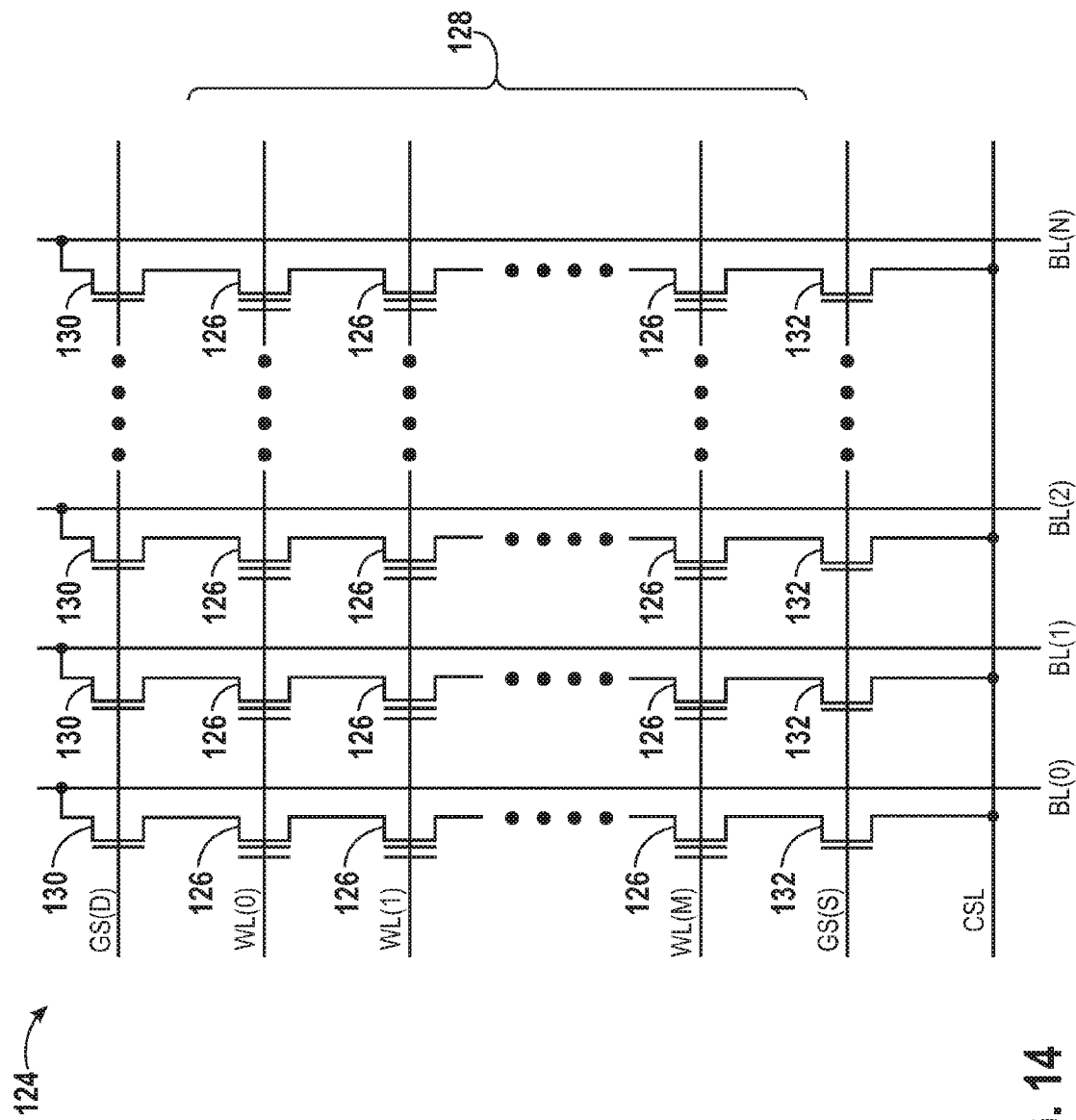
FIG. 14 is schematic diagram of a NAND flash memory array having memory cells in accordance with one or more embodiments of the present invention.

FIG. 14 illustrates an embodiment of the memory array 100, of FIG. 2. In the present embodiment, the memory array 100 comprises a NAND memory array 124. The NAND memory array 124 includes word lines WL(0)-WL(M) and intersecting local bit lines BL(0)-BL(N). As will be appreciated, for ease of addressing in the digital environment, the number of word lines WL and the number of bit lines BL are each a power of two (e.g., 256 word lines WL by 4,096 bit lines BL). The local bit lines BL are coupled to global bit lines (not shown) in a many-to-one relationship.

The NAND memory array 124 includes a floating gate transistor 126 located at each intersection of a word line WL and a local bit line BL. The floating gate transistors 126 serve as non-volatile memory cells for storage of data in the NAND memory array 124, as previously described. As will be appreciated, each floating gate transistor includes a source, a drain, a floating gate, and a control gate. The control gate of each floating gate transistor 126 is coupled to a respective word line WL. The floating gate transistors 126 are connected in series, source to drain, to form a NAND string 128 formed between gate select lines. Specifically, the NAND strings 128 are formed between the drain select line GS(D) and the source select line GS(S). The drain select line GS(D) is coupled to each NAND string 128 through a respective drain select gate 130. Similarly, the source select line GS(S) is coupled to each NAND string 128 through a respective source select gate 132. The drain select gates 130 and the source select gates 132 may each comprise a field-effect transistor (FET), for instance. A column of the memory array 124 includes a NAND string 128 and the source select gate 132 and drain select gate 130 connected thereto. A row of the floating gate transistors 126 are those transistors commonly coupled to a given word line WL.

The source of each source select gate 132 is connected to a common source line CSL. The drain of each source select gate 132 is coupled to the source of a floating gate transistor 126 in a respective NAND string 128. The gate of each source select gate 132 is coupled to the source select line GS(S).

The drain of each drain select gate 130 is connected to a respective local bit line BL for the corresponding NAND string 128. The source of each drain select gate 130 is connected to the drain of a floating gate transistor 126 of a respective NAND string 128. Accordingly, as illustrated in FIG. 3, each NAND sting 128 is coupled between a respective drain select gate 130 and source select gate 132. The gate of each drain select gate 130 is coupled to the drain select line GS(D).

During operation of the NAND memory array 124, various voltages are generated within the memory device 98. For instance, the memory device may require multiple voltage levels applied to the word lines, bit lines, and the like, to program, read, erase and verify values stored in the cells of the memory array 100. Accordingly, the voltage generator 112 of FIG. 13 may be representative of one or multiple internal voltage generators (such as the voltage generator 10) that each output a specific voltage. During operation, each internal voltage generator 112 may receive and condition an externally supplied voltage, e.g., common bus voltage, and output a voltage level (i.e., "output voltage") desired for the various operations within the memory device 98. It is generally desired that each output voltage include an accurate voltage level so that each memory operation, i.e., program, read, erase and verify, is conducted properly. The voltage generator 112 may include any combination of the embodiments discussed previously with regard to FIGS. 1-11.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A device for generating voltage, comprising:
a charge pump circuit comprising a first transistor;
a high-voltage switch circuit coupled to a cut-off switch circuit;
the cut-off switch circuit configured to be enabled when the charge pump circuit is operating and disabled when the charge pump circuit is not operating to reduce leakage current from the charge pump circuit, the cut-off switch comprising a second transistor, wherein an output of the charge pump circuit is coupled to one of a source node and a drain node of the second transistor, and a first control signal is input at a gate of the second transistor; and
a discharge circuit configured to discharge the charge pump circuit to a lower potential when the charge pump circuit is not operating.

2. The device of claim 1, wherein the first transistor is of a first conductivity type and the second transistor is of a second conductivity type that is different from the first conductivity type.

3. The device of claim 1, wherein the second transistor is a pmosfet device.

4. The device of claim 1, wherein the charge pump circuit is configured to receive a supply voltage, and wherein a voltage level of a logic-high of the first control signal is the same as a level of the supply voltage.

5. The device of claim 1, wherein the first control signal is logic-high during a period when the charge pump circuit is not operating.

6. The device of claim 1, wherein the charge pump circuit is configured to output a negative voltage.

7. The device of claim 1, wherein the first control signal is logic-low during a period when the charge pump circuit is not operating.

8. The device of claim 1, wherein the high-voltage switch circuit is configured to route voltage output by the charge pump circuit to various locations in a memory device.

9. The device of claim 8, wherein the various locations comprise a gate of a memory cell in the memory device.

10. The device of claim 1, wherein the discharge circuit is coupled to one of the source node and the drain node of the second transistor.

11. The device of claim 10, wherein the discharge circuit comprises a third transistor, wherein one of source node and the drain node of the second transistor is coupled to one of a source node and a drain node of the third transistor, and a second control signal is input at a gate of the third transistor.

12. The device of claim 11, wherein the first control signal and the second control signal are the same.

13. The device of claim 11, wherein a state of the first control signal is configured to change from a first state to a second state after the second control signal changes from the first state to the second state, and the first control signal is configured to change from the second state to the first state prior to the second control signal changing from the second state to the first state.

14. The device of claim 10, wherein the discharge circuit comprises a third transistor and a fourth transistor, wherein one of the source node and the drain node of the second transistor is coupled to one of a source node and a drain node of the third transistor, one of a source node and a drain node of the third transistor is coupled to one of a source node and a drain node of the fourth transistor, and a second control signal is input at a gate of the third transistor, and a third control signal comprising the inverse of the second control signal is input at a gate of the fourth transistor.

15. The device of claim 14, wherein the third transistor comprises a depletion type nmosfet device and the fourth transistor comprises an enhancement type pmosfet device.

16. The device of claim 1, wherein the charge pump circuit comprises a third transistor, a first capacitor, and a second capacitor;
wherein the discharge circuit comprises:
a fourth transistor coupled to a gate of the first transistor, wherein the fourth transistor is configured to discharge the gate of the first transistor to a lower potential when the charge pump circuit is not operating;
a fifth transistor coupled to a gate of the third transistor, wherein the fifth transistor is configured to discharge the gate of the third transistor to a lower potential when the charge pump circuit is not operating;
a sixth transistor coupled to the first capacitor, wherein the sixth transistor is configured to discharge the first capacitor to a lower potential when the charge pump circuit is not operating;
a seventh transistor coupled to the first capacitor, wherein the sixth transistor is configured to discharge the first capacitor to a lower potential when the charge pump circuit is not operating; and
an eighth transistor, coupled to the fourth, fifth, sixth, and seventh transistors.

17. A method for generating voltage, comprising:
enabling a first transistor coupled to an output of a charge pump circuit when the charge pump circuit is operating;

disabling the first transistor coupled to the output of the charge pump circuit when the charge pump circuit is not operating; and enabling a second transistor coupled to the first transistor to discharge the charge pump circuit to a lower potential when the charge pump circuit is not operating.

18. The method of claim 17, wherein disabling the first transistor comprises reducing current across the transistor to reduce a stand-by leakage current from the charge pump circuit.

19. The method of claim 17, comprising disabling a second transistor coupled to one of a source node and a drain node of the first transistor when the charge pump circuit is operating.

20. The method of claim 19, wherein enabling and disabling the first transistor and the second transistor comprises inputting a first control signal to the first transistor and a second control signal to the second transistor, wherein the first control signal and the second control signal are the same.

21. The method of claim 19, wherein enabling and disabling the first transistor and the second transistor comprises inputting a first control signal to the first transistor and a second control signal to the second transistor, and wherein the first control signal is configured to transition from a first state to a second after the second control signal transitions from the first state to the second state, and to transition from the second state to the first prior to the second control signal transitioning from the second state to the first state.

22. A circuit for generating voltage, comprising:
a charge pump circuit comprising a first transistor;
a high-voltage switch circuit coupled to a cut-off switch circuit;
the cut-off switch arranged to be enabled or disabled based on an operation of the charge pump circuit to reduce leakage current from the charge pump circuit, the cut-off switch comprising a second transistor, wherein an output of the charge pump circuit is coupled to one of a source node and a drain node of the second transistor, and a first control signal is input at a gate of the second transistor; and
a discharge circuit coupled to one of the source node and the drain node of the second transistor, wherein the discharge circuit comprises a third transistor and a fourth transistor, wherein one of the source node and the drain node of the second transistor is coupled to one of a source node and a drain node of the third transistor, one of a source node and a drain node of the third transistor is coupled to one of a source node and a drain node of the fourth transistor, and a second control signal is input at a gate of the third transistor, and a third control signal comprising the inverse of the second control signal is input at a gate of the fourth transistor.

23. A device, comprising:
a charge pump circuit comprising:
an internal node at a gate of a first transistor or a first capacitor in the charge pump circuit, wherein the first transistor and the first capacitor are configured to enable the charge pump circuit to generate a high voltage; and
an output node on an output path of the charge pump circuit, wherein the output path is configured to output the high voltage from the charge pump circuit;
a first discharge circuit coupled to the internal node of the charge pump circuit, wherein the first discharge circuit is configured to discharge the internal node to a lower potential during a period when the charge pump circuit is not operating; and
a second discharge circuit coupled to the output node of the charge pump circuit, wherein the second discharge circuit is configured to discharge the output node to a lower potential during the period when the charge pump circuit is not operating.

24. The device of claim 23, comprising a third discharge circuit coupled to a gate of the first transistor, wherein the third discharge circuit is configured to discharge the gate of the first transistor to a lower potential during the period when the charge pump circuit is not operating,
wherein the first discharge circuit is coupled to the first capacitor.

25. The device of claim 24, wherein the charge pump circuit comprises a second transistor and a second capacitor configured to enable the charge pump circuit to generate the high voltage;
wherein the device comprises:
a fourth discharge circuit coupled to a gate of the second transistor, wherein the fourth discharge circuit is configured to discharge the gate of the second transistor to a lower potential during the period when the charge pump circuit is not operating; and
a fifth discharge circuit coupled to the second capacitor, wherein the fifth discharge circuit is configured to discharge the second capacitor to a lower potential during the period when the charge pump circuit is not operating.

26. A voltage generator, comprising:
a charge pump circuit;
a cut-off switch circuit comprising a first transistor, wherein the first transistor is configured to be enabled when the charge pump circuit is operating and disabled when the charge pump circuit is not operating to reduce leakage current from the charge pump circuit;
a discharge circuit coupled to one of a source node and a drain node of the first transistor, wherein the discharge circuit is configured to discharge the charge pump circuit to a lower potential when the charge pump circuit is not operating; and
a high-voltage switch coupled to one of the source node and the drain node of the first transistor.

27. The voltage generator of claim 26, wherein the high-voltage switch is configured to route voltage output by the charge pump circuit to various locations in a memory device.

28. The voltage generator of claim 26, wherein the discharge circuit comprises a second transistor and a third transistor, wherein one of a source node and a drain node of the first transistor is coupled to one of a source node and a drain node of the second transistor, one of a source node and a drain node of the second transistor is coupled to one of a source node and a drain node of the third transistor, and a first control signal is input at a gate of the second transistor, and a second control signal comprising the inverse of the first control signal is input at a gate of the fourth transistor.

* * * * *